(12) United States Patent
Cramm et al.

(10) Patent No.: US 7,848,474 B2
(45) Date of Patent: Dec. 7, 2010

(54) SIGNAL TIMING PHASE SELECTION AND TIMING ACQUISITION APPARATUS AND TECHNIQUES

(75) Inventors: Colin Cramm, Kanata (CA); Shawn Scouten, Ottawa (CA); Kenji Suzuki, Kanata (CA); Brian Wall, Stittsville (CA); Malcolm Stevens, North Gower (CA)

(73) Assignee: Cortina SyStems, Inc., Sunnyvale, CA (US)

( * ) Notice: Subject to any disclaimer, the term of this patent is extended or adjusted under 35 U.S.C. 154(b) by 720 days.

(21) Appl. No.: 11/822,725

(22) Filed: Jul. 9, 2007

(65) Prior Publication Data

US 2009/0016477 A1 Jan. 15, 2009

(51) Int. Cl.
*H03D 3/24* (2006.01)
(52) U.S. Cl. ...................................................... 375/376
(58) Field of Classification Search ......... 375/354–355, 375/362, 365, 368, 373, 376; 370/503, 509, 370/516
See application file for complete search history.

(56) References Cited

U.S. PATENT DOCUMENTS 4,542,351 A * 9/1985 Okada .......................... 331/11
4,958,228 A * 9/1990 Kutsuki ....................... 348/537
5,068,628 A * 11/1991 Ghoshal ..................... 331/1 A
5,850,422 A * 12/1998 Chen .......................... 375/371
7,133,481 B2 * 11/2006 Azakami et al. ............. 375/355

OTHER PUBLICATIONS

Floyd M. Gardner, "Equivocation as a Cause of PLL Hangup", IEEE Transactions on Communications, vol. Com-30, No. 10, Oct. 1982; pp. 2242-2243.

Floyd M. Gardner, "Hangup in Phase-Lock Loops"; IEEE Transactions on Communications, vol. Com-25, No. 10, Oct. 1977; pp. 1210-1214.

D.P. Taylor, S.K. Tang, S. Mariuz; "The Limit-Switched Loop: A Phase-Locked Loop for Burst Mode Operation"; IEEE Transactions on Communications, vol. Com-30, No. 2, Feb. 1982; pp. 396-407.

* cited by examiner

*Primary Examiner*—Khanh C Tran

(57) ABSTRACT

Signal timing phase selection and timing acquisition apparatus and techniques are disclosed. A timing phase that is most closely aligned with a phase of information carried by a received signal is selected from a plurality of timing phases. The selected timing phase may be used, for example, as a reference signal for a phase detector in a Phase-Locked Loop (PLL). The received signal may be sampled one or more times per timing phase. In a multiple-sample implementation, the samples may be used for timing phase selection, for detection of a known initial pattern of a burst of information to thereby detect the start time of a an information burst, or both.

19 Claims, 6 Drawing Sheets

SIGNAL TIMING PHASE SELECTION AND TIMING ACQUISITION APPARATUS AND TECHNIQUES

FIELD OF THE INVENTION

This invention relates generally to communications and, in particular, to timing acquisition for communication signals.

BACKGROUND

In some communication environments, data to be received is transmitted in relatively short bursts, with random variations in phase between the bursts. It is important to acquire signal timing at a receiver quickly in such environments. However, random variations in phase can lead to conditions, at least for certain phase offsets, in which the time required by a Phase-Locked Loop (PLL) to acquire signal timing is unacceptably long. This condition in which the phase acquisition time of the PLL is extended, typically where the received data and a clock signal are 180° out of phase, is often referred to as the hang-up condition.

SUMMARY OF THE INVENTION

There remains a need for improved signal timing acquisition techniques.

Some embodiments of the invention provide for burst mode operation of PLLs with fast timing acquisition. Applications of such embodiments might include, among others, burst mode receivers for a Passive Optical Network (PON) used for delivery of data and information services in Fiber-To-The-Home (FTTH) systems, Time Division Multiple Access (TDMA) radio systems, and disk drive read/write channels, for example. More generally, embodiments of the invention could potentially be applied to any environment in which fast acquisition of timing information is desirable.

A mechanism and hardware are provided in some embodiments to enable a digital or analog PLL to complete timing acquisition within a relatively short period of time and/or avoid the hang-up condition.

According to an aspect of the invention, there is provided an apparatus that includes an interface operable to receive a signal carrying information, and a timing phase selection module operatively coupled to the interface and operable to select, from a plurality of timing phases, a timing phase most closely aligned with a phase of the information carried by the received signal.

The timing phase selection module may be operable to select the timing phase most closely aligned with a phase of the information carried by the received signal for use in generating a clock signal to be used in processing the received signal.

In some embodiments, the timing phase selection module includes a sampling module operatively coupled to the interface and operable to sample the received signal at least once per timing phase of the plurality of timing phases, and the timing phase selection module is operable to determine the timing phase most closely matched to the phase of the information carried by the received signal based on samples taken by the sampling module.

The sampling module may be operable to sample the received signal once per timing phase of the plurality of timing phases, in which case the sampling module may include a plurality of samplers operatively coupled to the interface, with each sampler being operable to sample the received signal according to a respective one of the plurality of timing phases.

If the sampling module is operable to sample the received signal multiple times per timing phase of the plurality of timing phases, it may include a plurality of sets of multiple samplers. Each set of samplers is operatively coupled to the interface and operable to sample the received signal multiple times according to a respective one of the plurality of timing phases.

The timing phase selection module may also include a pattern detection module operatively coupled to the sampling module and operable to determine the timing phase most closely matched to the phase of the information carried by the received signal by comparing the samples taken by the sampling module to a predetermined pattern. In some embodiments, the pattern detection module is controllable to select a number of the samples per timing phase taken by the sampling module to compare to the predetermined pattern.

The pattern detection module may include combinational logic operable to receive the samples taken by the sampling module and to generate a timing phase selection signal based on the samples. In some embodiments, the combinational logic implements at least one of: a truth table and a voting algorithm.

The predetermined pattern may include a known initial pattern of a burst of information, for example. In this case, the pattern detection module may be further operable to determine a start time of the burst of information in the received signal based on detection of the known initial pattern.

The plurality of timing phases may include timing phases based on different types of level transitions of a timing signal, or respective timing signals having different phases relative to each other.

Such an apparatus may be implemented, for example, in a PLL that also includes an oscillator operable to generate at least one timing signal comprising the plurality of timing phases, a multiplexer operatively coupled to the oscillator and to the timing phase selection module, the multiplexer being operable to receive at an input the plurality of timing phases and to provide at an output the selected timing phase, and a phase detector operatively coupled to the output of the multiplexer and to the oscillator, the phase detector being operable to detect a difference between the selected timing phase and a phase of the information carried by the received signal. If the timing phase selection module includes a sampling module operatively coupled to the interface and operable to sample the received signal at least once per timing phase of the plurality of timing phases and is operable to determine the timing phase most closely matched to the phase of the information carried by the received signal based on samples taken by the sampling module, and if the phase detector is operable to sample at least one of the received signal and the selected timing phase, the sampling module and the phase detector may include shared samplers.

A method is also provided, and includes providing at least one timing signal comprising a plurality of timing phases, receiving a signal carrying information, and selecting, from the plurality of timing phases, a timing phase most closely aligned with a phase of the information carried by the received signal.

The timing phase most closely aligned with a phase of the information carried by the received signal may be selected for use in generating a clock signal to be used in processing the received signal.

The operation of selecting may involve sampling the received signal at least once per timing phase of the plurality of timing phases.

Selecting may also involve comparing multiple samples associated with each timing phase of the plurality of timing phases to a predetermined pattern. The method may also involve selecting a number of the samples per timing phase to compare to the predetermined pattern.

The predetermined pattern may include a known initial pattern of a burst of information, in which case the method may also include determining a start time of the burst of information in the received signal based on detection of the known initial pattern.

As noted above, the plurality of timing phases may include timing phases based on different types of level transitions of the at least one timing signal, or a plurality of timing signals having different phases relative to each other.

In accordance with another aspect of the invention, an apparatus includes a sampling module operable to receive a signal carrying information and to sample the received signal multiple times according to a plurality of timing phases, and a pattern detection module operatively coupled to the sampling module and operable to compare the multiple samples associated with each timing phase of the plurality of timing phases to a known initial pattern of a burst of information and to determine a start time of the burst of information in the received signal based on detection of the known initial pattern.

Other aspects and features of embodiments of the present invention will become apparent to those ordinarily skilled in the art upon review of the following description.

BRIEF DESCRIPTION OF THE DRAWINGS

Examples of embodiments of the invention will now be described in greater detail with reference to the accompanying drawings.

DETAILED DESCRIPTION OF PREFERRED EMBODIMENTS

As discussed briefly above, conventional PLLs may be prone to the so-called hang-up condition or other conditions resulting in relatively slow timing acquisition. According to some embodiments of the invention, an antihang solution is provided by selecting as the phase reference for a PLL the Voltage Controlled Oscillator (VCO) clock phase, from a number of possible VCO clock phases, which is most closely aligned with the initial phase of burst data. Conventional PLL implementations typically use a fixed VCO clock phase for all received signals and thus all bursts.

In one possible implementation, the VCO clock of the PLL runs at an integer multiple of a data rate, and thereby provides a number of equally spaced VCO clock phases, which are also referred to herein as timing phases. Higher-integer multiple VCO clock rates could be used to provide more clock phases, and thus allow for greater precision of phase alignment with burst data. However, it should be appreciated that the integer multiple could be 1 in some embodiments. In this case, positive and negative edges of a single VCO clock signal provide two possible timing phases. A timing signal and an inverted version thereof, for example, could provide two timing phases based on different level transitions in a single timing signal.

A determination as to which VCO clock phase is most closely aligned with the phase of data in a received signal might involve sampling the received signal according to each available timing phase one or more times. Sampling the received signal multiple times over a number of cycles of each timing phase may improve tolerance to clock jitter and random noise. Any known information about an initial data pattern expected in a burst of information can be exploited to improve noise and jitter tolerance as well.

Both the received signal and the VCO clock signals could also be sampled at one or more points in time, with the phases then being compared to determine which clock signal is most closely aligned in phase with information in the received signal. Again, multiple samples over a number of cycles may improve tolerance to clock jitter and noise and provide for detection of a predetermined pattern such as an initial data pattern.

The same mechanism and hardware used to select a timing phase for a PLL clock input is also used in some embodiments to determine the start time of a received burst. This reduces uncertainty in the start time of the burst and can thus improve the overall throughput of a burst mode system.

These and other possible features of embodiments of the invention will become apparent to those skilled in the art from the disclosure provided herein. Before considering particular example embodiments of the invention in detail, conventional linear PLLs will be described.

Figure 1:
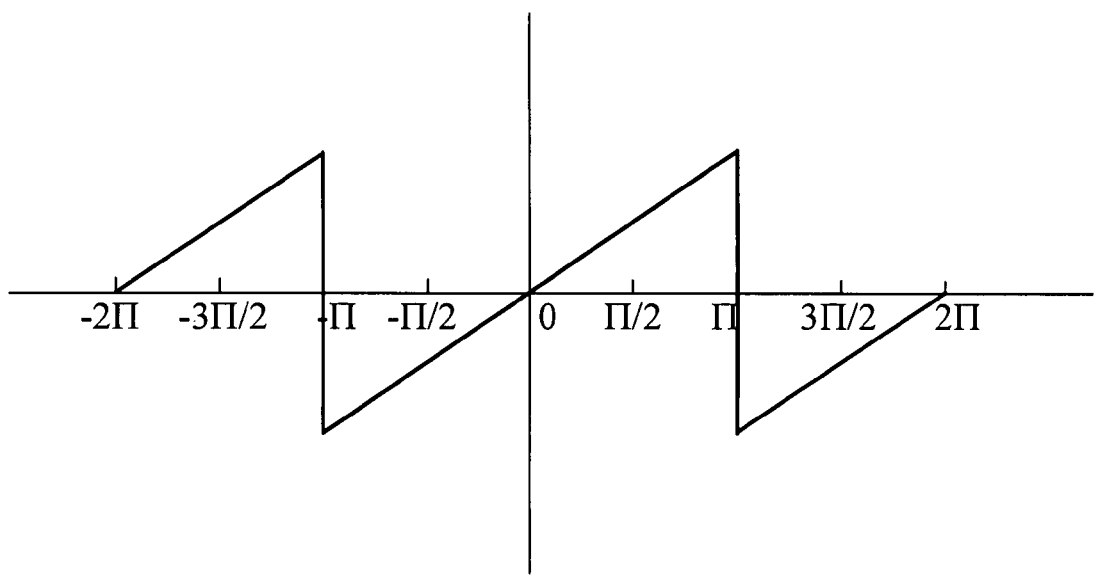
FIG. 1 shows an example phase detector characteristic of a conventional linear PLL.
Figure 2:
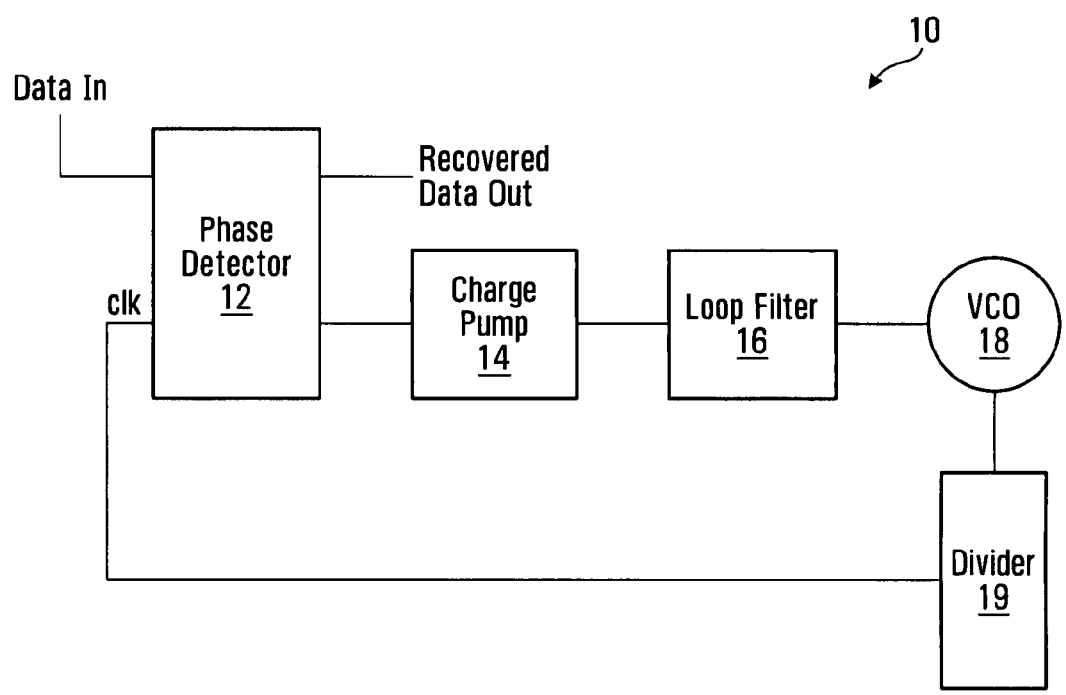
FIG. 2 is a block diagram of a conventional linear PLL.

FIG. 1 shows an example phase detector characteristic of a conventional linear PLL, and FIG. 2 is a block diagram of such a conventional linear PLL 10, which includes a phase detector 12. The PLL 10 also includes a charge pump 14, a loop filter 16, a VCO 18, and a divider 19, which are interconnected with the phase detector 12 and each other as shown. Those skilled in the art will be familiar with the components of a conventional PLL such as 10, as well as their operation to acquire timing of data that is input to the phase detector 12. The operation of the PLL 10 is therefore not described in detail.

As shown in FIG. 1, the phase detector 12 provides an output having a magnitude that varies linearly with a detected difference in phase between its data and reference clock inputs. There are however, discontinuous regions in this example phase detector characteristic at a phase difference of +/−Π radians where the output of the phase detector is not well defined and may jump suddenly from a large positive value to a large negative value. This results in the possibility of a hang-up condition when the phase of the recovered data is 180° out of phase with the reference clock. Other possible phase detector characteristics similarly have specific phase offsets where the phase detector output is either zero or discontinuous, which may result in the occurrence of the hang-up condition at these specific phase offsets.

Figure 3:
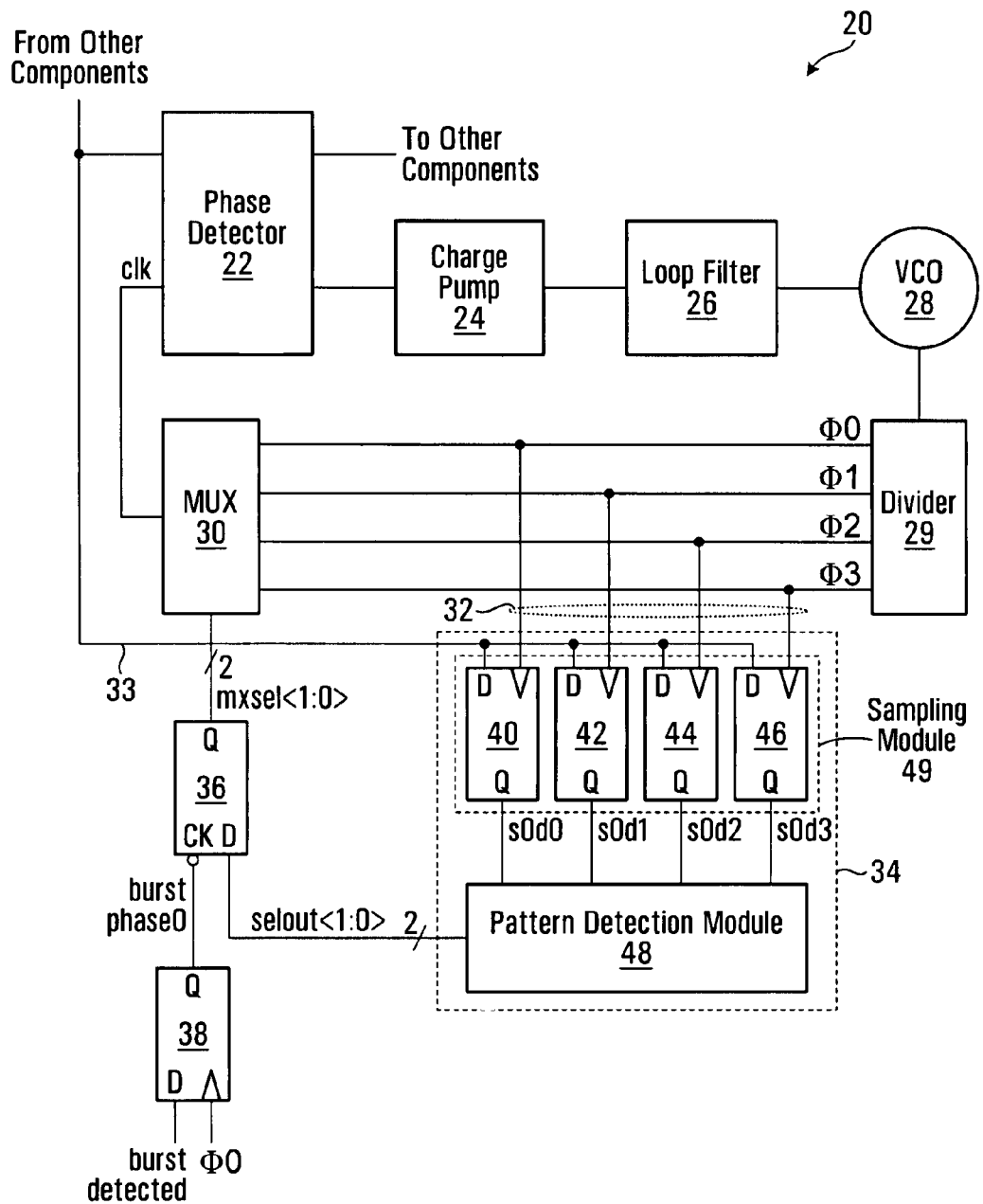
FIG. 3 is a block diagram of an example apparatus according to an embodiment of the invention.

Turning now to FIG. 3, a block diagram of an example apparatus 20 according to an embodiment of the invention is shown. The apparatus 20 includes a phase detector 22, a charge pump 24, a loop filter 26, a VCO 28, a divider 29, and a multiplexer (MUX) 30 operatively coupled together as a PLL. A timing phase selection module 34 is operatively coupled at 32 to the VCO 28 through the divider 29, and also has an interface 33 through which a signal carrying data, or more generally information, may be received. A two-bit timing phase selection output signal selout<1:0> from the timing phase selection module 34 is provided to the multiplexer 30 through a transparent latch 36, which is clocked by an output from a signal conditioning D flip flop 38. The timing phase selection module 34 includes a sampling module 49, which includes samplers 40, 42, 44, 46 and a pattern detection module 48.

Those skilled in the art will be familiar with many possible forms of phase detectors, charge pumps, loop filters, VCOs, and dividers. A PLL is one example of an implementation of a timing acquisition scheme that might be used to extract timing information from a data stream. However, the present invention is in no way restricted to implementation in conjunction with a PLL or any other timing generation and/or alignment device.

Similarly, the multiplexer 30 represents one example of a component that supports a selection function, and is controllable to provide at an output a particular signal received on one of multiple inputs. Other components that provide this type of functionality may be or become apparent to those skilled in the art, and may be substituted for the multiplexer 30.

The timing phase selection module 34 receives timing signals and information signals through interfaces 32, 33, which in the example shown are simply connections. Other types of interfaces, including direct or indirect connections through traces, conductors, and/or connectors, for example, are possible.

The D flip-flops shown in FIG. 3 are also intended as an example of one possible implementation of the samplers 40, 42, 44, 46 and the burst detected signal conditioning element 38.

The pattern detection module 48 may be implemented, for example, using combinational logic as noted below. Other implementations to carry out the functions of the pattern detection module 48 may also be or become apparent to those skilled in the art.

It should thus be appreciated that FIG. 3, as well as the contents of the other drawings, are intended solely for illustrative purposes, and that the present invention is in no way limited to the particular example embodiments explicitly shown in the drawings and described herein. The various components of the apparatus 20 may be implemented in other ways and using different elements than specifically shown.

The numbers of certain elements may also vary. In the example shown, four timing signals having different phases $\Phi 1, \Phi 2, \Phi 3, \Phi 4$ with respect to each other are provided by the VCO 28 and the divider 29, and the received signal is sampled by the samplers 40, 42, 44, 46 according to a respective one of the timing signals. More or fewer timing signals, timing phases, and/or samplers may be provided in other embodiments.

In general, other embodiments may be implemented using further, fewer, or different elements, which may be interconnected in a similar or different manner.

Considering now the operation of the apparatus 10, the VCO 28 might run at any of a number of frequencies. Where the VCO is operated at a frequency of two times the basic data rate in a received signal, the divider 29 can provide the four different timing signals having respective phases $\Phi 1, \Phi 2, \Phi 3, \Phi 4$ by dividing the frequency of the VCO output to generate two signals at the data rate, and providing normal and inverted versions of the two divided signals. This is the type of mechanism represented in FIG. 3 and FIG. 4, where four different timing signals are provided by the divider 29. As will be apparent from FIG. 4, the timing signal having phase $\Phi 2$ is an inverted version of the timing signal having phase $\Phi 0$, and similarly the timing signal having phase $\Phi 3$ is an inverted version of the timing signal having phase $\Phi 1$.

Inverted and non-inverted version of divided signals might be available in the divider 29, such as where a differential implementation of the divider is used. In other embodiments, a signal inversion function might be provided separately from the divider 29.

However, other mechanisms are also contemplated. For example, in another four-phase embodiment, the VCO 28 might instead operate at four times the data rate, in which case the divider 29 could divide the VCO output frequency by four to make available 4 possible timing phases.

It should also be appreciated that the VCO 28 and the divider 29 are provided as illustrative examples of a circuit that could be used as a timing phase generator to generate different timing phases. A quadrature VCO or a 4 stage ring oscillator are other examples of an oscillator that could potentially be used for this purpose. Other implementations might employ any of various frequency division, frequency multiplication, and/or phase shifting techniques to provide multiple timing phases. The present invention is in no way limited to any particular technique or source for generating timing signals or timing phases.

Each of the four possible timing phases, which in the example shown correspond to the four timing signals having phases $\Phi 1, \Phi 2, \Phi 3, \Phi 4$, is used to sample a received signal using the four samplers 40, 42, 44, 46. FIG. 3 shows D flip-flops as the samplers 40, 42, 44, 46, with outputs being designated s0d0, s0d1, s0d2, s0d3. The sampled data outputs are input to the pattern detection module 48, which could be implemented as a combinational logic block, for instance. The pattern to be detected by the pattern detection module 48 could be a single bit or transition, since the sampling module 49 samples the received signal only once per timing phase. In other embodiments, as described in detail below, a multi-bit pattern is detected.

The pattern detection module 48 generates the 2-bit selout<1:0> timing phase selection signal corresponding to the timing phase that is most closely aligned with the information in the received signal. A 2-bit multiplexer select signal mxsel<1:0> is a version of the selout<1:0> signal that has been conditioned by appropriate timing and burst detection signals. The mxsel<1:0> signal is provided as a control input to the 4-input multiplexer 30 to select one of the four available timing phases to be used as an input to the phase detector 22.

In the example shown in FIG. 3, the selout<1:0> signal is conditioned by one of the timing signals, the timing signal having phase $\Phi 0$, and a burst detected signal. The burst detected signal might be received from other components of a receiver, for example, when a burst of information has been detected. For illustrative purposes, the timing signal having phase $\Phi 0$ is assumed to be leading the other timing signals having respective phases $\Phi 1, \Phi 2, \Phi 3$, and therefore is used to clock the positive edge triggered signal conditioning D flip flop 38. This way, a transition occurs in the burst phase0 signal output by the D flip-flop 38 at the end of a sampling cycle that immediately preceded the detection of a burst.

Figure 4:
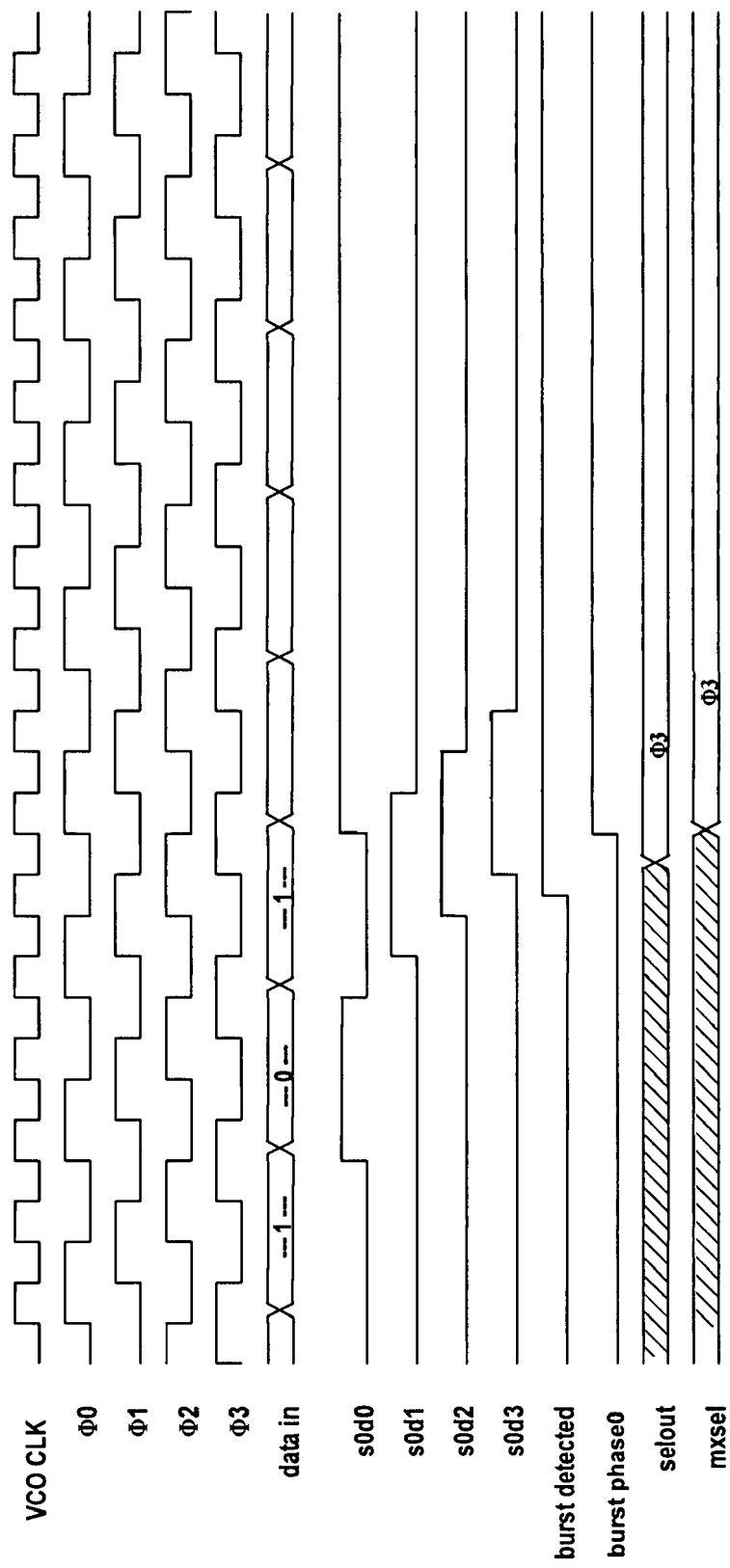
FIG. 4 is an example timing diagram.

FIG. 4 shows a timing diagram that is useful in further illustrating the operation of the apparatus 20. As shown, the sampler outputs s0d0, s0d1, s0d2, s0d3 are 90° out of phase and are continuously sampling the input data. An asynchronous input burst detected signal is provided from an external source, and indicates that the beginning of a burst of data has been detected. In this case, it is assumed that the burst of data begins with a preamble that includes a known data sequence, which in the example shown is an alternating 101010 . . . pattern.

The burst detected signal is conditioned to be valid only on the positive edge of the timing phase Φ0 by the flip-flop 38 (FIG. 3). The burst phase0 output is then used as the clock input to the 2-bit transparent latch 36, which is used to hold the previously generated 2-bit selout<1:0> signal. The output of the 2-bit transparent latch 36, the mxsel<1:0> signal, is held valid for the remainder of the entire burst of data, allowing the 4-input multiplexer 30 to select the appropriate timing phase for use with the phase detector 22.

The pattern detection module 48 receives as its input the values of the four sequential samples s0d0, s0d1, s0d2, s0d3 of the incoming data and calculates from them the appropriate timing phase to select for use with the phase detector 22. In order to avoid the hang-up condition, and to achieve phase lock as quickly as possible, the most desirable timing phase to select would be the timing phase that has a level transition, which could be a positive edge or negative edge depending on the specific data contents, centred exactly in the middle of a data bit.

For the situation shown in FIG. 4, the samples are:

| | |
|---|---|
| s0d0 | 0; |
| s0d1 | 1; |
| s0d2 | 1; |
| s0d3 | 1. |

In this case, the desired timing phase to select would be either timing phase Φ2 or Φ3. In the example shown, the 1010 . . . pattern is being sampled at four times the basic data rate, which would generate a sample pattern of 1111000011110000 . . . . The centre of the eye for this pattern would be between the secondhand third 1 if a one is being sampled, or between the second and third 0 if a zero is being sampled. In practical terms, there is no timing phase that is halfway between samples, so either the second or third sample can be chosen and will be equally close to the true centre.

At this level of resolution both of the clock phases Φ2 and Φ3 are equally desirable. Similarly, for all the other possible combinations of sampled data, the desired timing phase to be selected for use with the phase detector 22 can be calculated. In a combinational logic implementation of the pattern detection module 48, a truth table can be determined for the combinations. As will be apparent to those skilled in the art, such truth tables may be implemented using any of various logic circuits.

An expected data pattern such as in a preamble might be implicitly used to calculate the selout<1:0> signal. Where some of the possible sample sequences represent error conditions not to be expected during normal operation, those sequences could be used to generate an error condition indication if desired.

Figure 5:
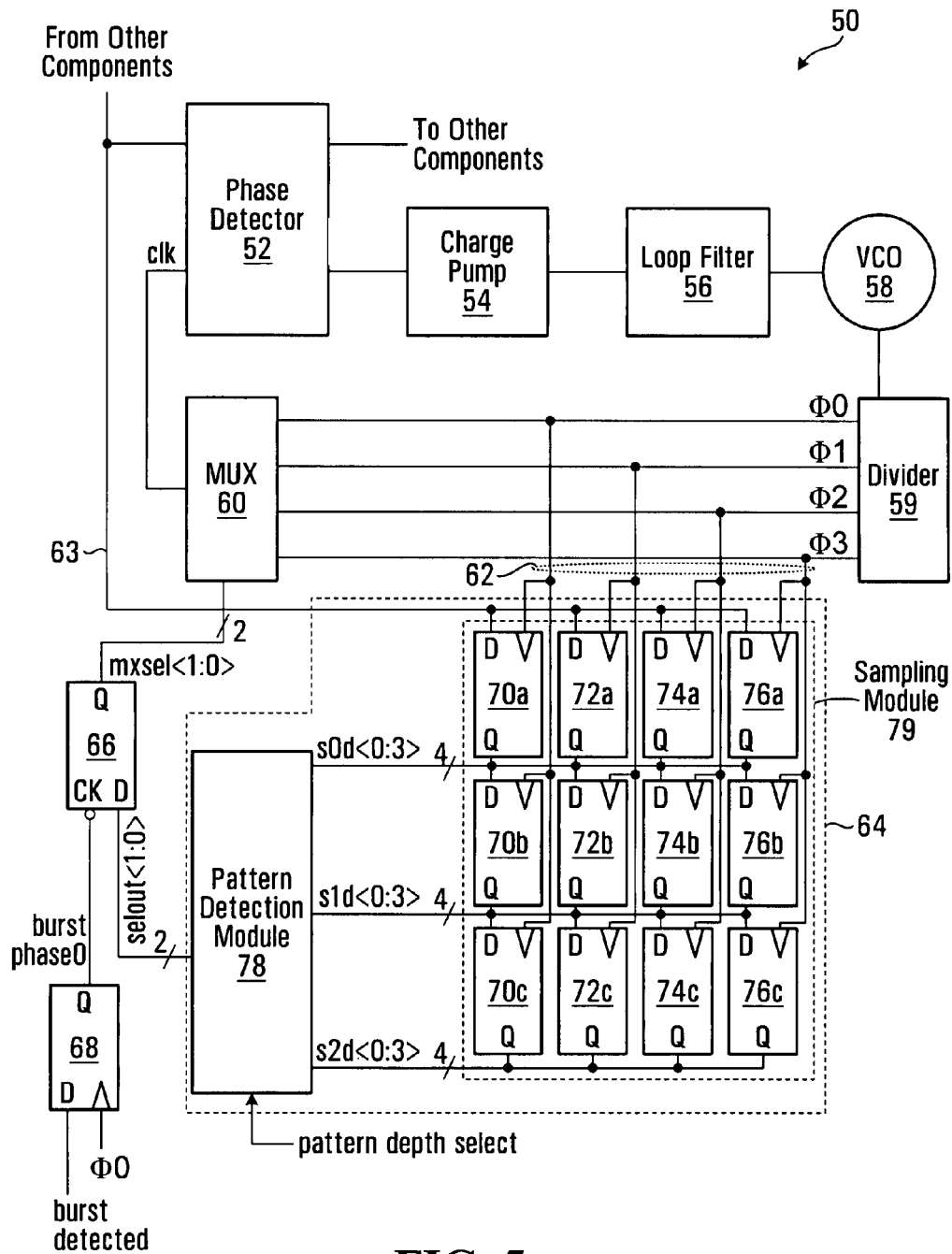
FIG. 5 is a block diagram of an example apparatus according to another embodiment of the invention.

FIG. 3 is an example implementation of an apparatus that samples a received signal only once per timing phase. FIG. 5 is a block diagram of an example apparatus according to another embodiment of the invention, in which a received signal is sampled multiple times per timing phase. The apparatus 50 makes use of current sampled data values as well as two previous sets of sampled data values, as described in further detail below.

The apparatus 50 is substantially similar in structure and operation to the apparatus 20 (FIG. 3). As shown, the apparatus 50 includes a phase detector 52, a charge pump 54, a loop filter 56, a VCO 58, a divider 59, and a multiplexer 60 interconnected to form a PLL. A timing phase selection module 64 includes a sampling module 79 and a pattern detection module 78, and receives timing phases and a signal carrying information through interfaces 62, 63. A selout<1:0> signal output by the timing phase selection module 64 is conditioned by a burst detected signal and a timing phase using the latch 66 and a D flip-flop 68.

It will be readily apparent from FIG. 5 that the apparatus 50 differs from the apparatus 30 (FIG. 3) in that it includes four sets 70, 72, 74, 76 of three samplers a, b, c, which are positive edge triggered D flip-flops in the example shown. Each set 70, 72, 74, 76 samples a received signal multiple times according to a respective timing phase. The sampler 70a directly samples the received signal according to the timing phase Φ0, and samples are effectively passed along the set of samplers to the samplers 70b, 70c at each sample time. The other sets 72, 74, 76 of samplers a, b, c operate in a substantially similar manner, although in accordance with different timing phases.

The sampling module 79 thereby provides to the pattern detection module 78, which like the module 48 of the apparatus 20 (FIG. 3) could be implemented in combinational logic, three samples per timing phase. The pattern detection module 78 calculates and outputs the selout<1:0> signal based on three samples per timing phase instead of a single sample per timing phase. The timing diagram of FIG. 4 is thus also partly relevant to the apparatus 50, except that additional samples s1d<0:3>, s2d<0:3> would be taken by the sampling module 79 at subsequent edges of the timing signals having phases Φ0, Φ1, Φ2, Φ3.

In some embodiments, the "depth" of the pattern detection module 78 is also controllable. This is represented in FIG. 5 by the pattern depth select signal input to the pattern detection module 78, which could be selected or otherwise input by a user or generated by another component or subsystem of a receiver in which the apparatus 50 is implemented. Logic components in the pattern detection module 78 could be enabled based on the pattern depth select signal, for instance.

With a one-bit pattern depth select signal, for example, a 0 value might cause simpler pattern detection logic with a depth of 1 to be used, substantially as described above with reference to FIG. 3, and a 1 value might cause more complex logic with a depth of 3 to be used. More than two pattern detection depths could be supported in the apparatus 50 by using a multi-bit pattern depth select signal, and depths of greater than 3 could be supported by providing more than three samplers a, b, c in each set 70, 72, 74, 76.

Thus, even if multiple samples per timing phase are available to the pattern detection module 78, not all of those samples need necessarily be used for pattern detection. This allows different pattern detection depths to be implemented in the same hardware. A longer pattern detection depth would generally have better error tolerance, but would involve more processing time due to additional pattern detection bits. The pattern depth select signal provides for control, and potentially dynamic control, of this tradeoff.

Although not specifically shown in FIG. 5, the samplers of the sampling module 79 could also be controllable such that only a subset of the samplers is enabled to actually sample a received signal when a reduced pattern detection depth is selected. For a depth of 1, for example, only the samplers 70a, 72a, 74a, 76a might be enabled, for example.

One advantage of using multiple sampled values is that the additional samples can be used to provide more reliable selection of the desired timing phase in the presence of various impairments of or distortions to an incoming signal. For example, the most closely aligned timing phase could be determined even in the presence of jitter on an incoming data stream and/or bit errors in a known data pattern such as a preamble.

An example of a form of combinational logic processing that could be used to accomplish this type of function is majority voting (2 out of 3, in the example shown) on bits (s0d0, ~s1d0, s2d0) and on bits (s0d1, ~s1d1, s2d1), (s0d2, ~s1d2, s2d2), (s0d3, ~s1d3, s2d3) where ~sxdy is the complement of bit sxdy. The result of this majority voting is a sequence of four sampled data bits that can be processed substantially as described above to determine the optimum clock phase to select for use by the phase detector 52. It should be appreciated that any of many other possible algorithms could be used, depending on such factors as the number of available samples per timing phase and the number of inputs to the pattern detection module 78.

A series of multiple samples might also or instead be used to determine the start time of a burst of information. The pattern detection module 78 could compare the multiple samples associated with each timing phase with a known initial pattern of a burst of information, illustratively an expected data pattern in a preamble, and determine a start time of the burst based on detection of the known initial pattern. In this case, conditioning of the selout<1:0> signal could be performed internally in the timing phase selection module 64 instead of externally using the latch 66 and the flip-flop 68.

Figure 6:
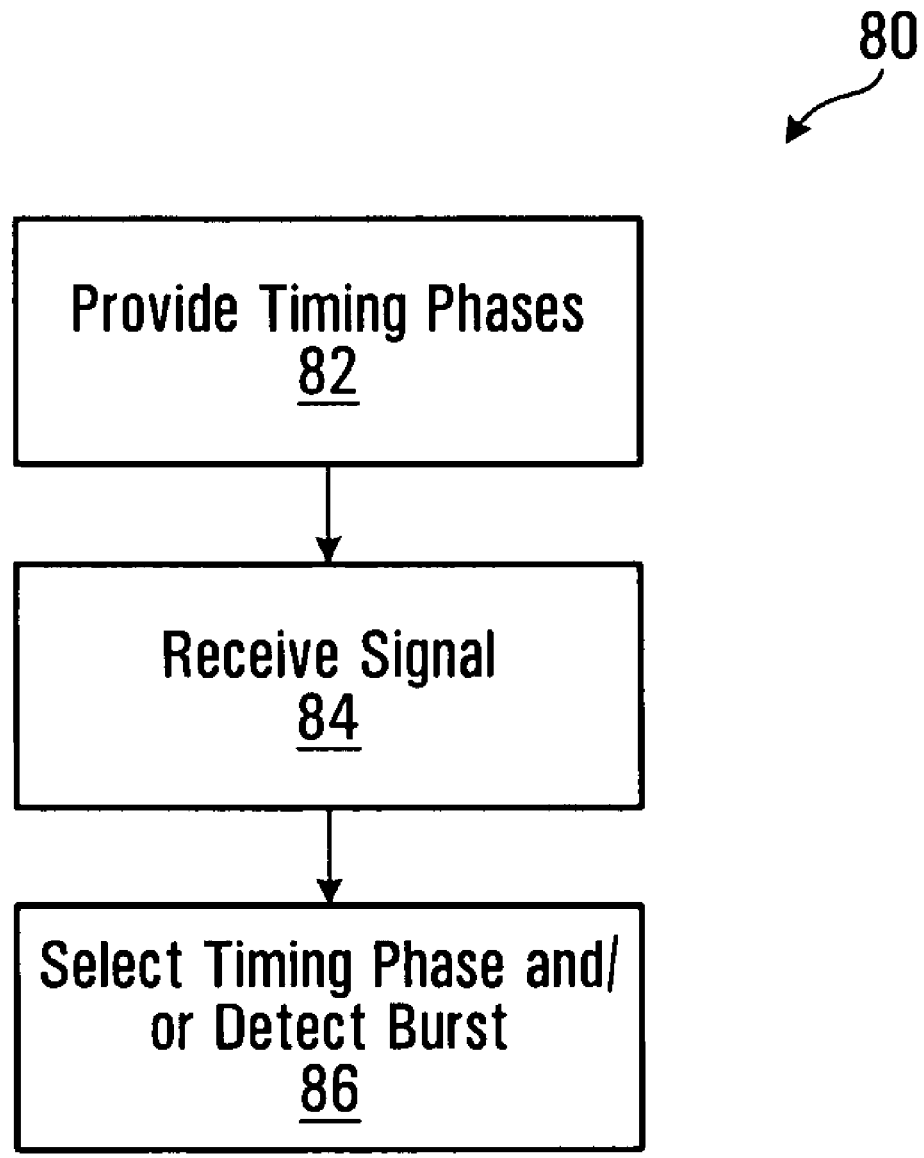
FIG. 6 is a flow diagram illustrating an example method according to a further embodiment of the invention.

Embodiments of the invention have been described above primarily in the context of apparatus. FIG. 6 is a flow diagram illustrating an example method according to a further embodiment of the invention.

The method 80 involves providing at 82 at least one timing signal that includes a plurality of timing phases. The timing signal or signals may be generated by a VCO oscillator as part of a PLL for example. At 84, a signal that carries information is received, and at 86 a timing phase that is most closely aligned with a phase of the information carried by the received signal is selected, from the timing phases provided at 82. The beginning of a burst of information may also or instead be detected at 86, where multiple samples of the signal received at 84 are taken according to each of the timing phases provided at 86.

The method 80 is illustrative of one embodiment of the invention. Other embodiments may include fewer, further, or different operations, performed in a similar or different order, than shown. These and other operations may also be performed in any of various ways. Some possible variations of the method 80 may be or become apparent from the foregoing description of the apparatus 20, 50, for example.

Embodiments of the present invention may be used to allow timing information to be acquired quickly in environments of burst mode data transmission with random phase variations. By selecting an initial timing phase that is most closely aligned with a received data burst, timing acquisition tends to be faster than in conventional techniques that use only a single initial reference clock signal for all bursts. The single initial reference clock signal would in many cases be less closely aligned with received data than at least one of the multiple timing phases used in accordance with embodiments of the present invention.

The techniques disclosed herein can also enable the use of a PLL in such environments, delivering all of the benefits associated with use of a PLL over other methods of timing acquisition, such as lower jitter, lower power, and robust operation. Estimates of initial phase error are not required, thereby avoiding any issues with inaccurate phase estimates inherent in some conventional antihang solutions.

What has been described is merely illustrative of the application of principles of embodiments of the invention. Other arrangements and methods can be implemented by those skilled in the art without departing from the scope of the present invention.

For example, FIGS. 3 and 5 show apparatus 20, 50 in which a received signal that carries information is sampled at least once per timing phase. In other embodiments, both a received signal and each timing signal could be sampled at one or more instants in time, with phases then being compared to detect which timing phase is most closely aligned with the information carried by the received signal.

Those skilled in the art will be familiar with sampling phase detectors that sample at least one of a received signal and a reference timing or clock signal. A sampling phase detector could be implemented as the phase detector 22, 52 in the apparatus 20, 50, for instance. In this case, the phase detector 22, 52 and the sampling module 39, 79 might share samplers so as to more closely match logic delays in the phase detector and a timing phase selection module.

Systems or devices in which or in conjunction with which an apparatus according to an embodiment of the invention may be implemented could include other components that have not been specifically shown in the drawings or described above. For example, it should be apparent from FIGS. 3 and 5 that the apparatus 20, 50 may receive data signals from and possibly provide recovered data to other components of a receiver. The apparatus 20, 50 may also or instead receive a burst detected signal from other receiver components. In some embodiments, the techniques disclosed herein are provided for determining correct phase after a correct timing frequency has been determined by other receiver components. Thus, more generally, embodiments of the invention may be used to enable or complement other functions of a device such as a communication signal receiver.

It should also be appreciated that a timing phase selected according to the techniques disclosed herein could be selected for any of various purposes. A reference timing signal for a PLL phase detector is an example of one possible use. In general, a selected timing phase could be used for detecting information in a received signal or for otherwise processing the received signal, for instance.

In addition, although described primarily in the context of methods and systems, other implementations of the invention are also contemplated, as instructions stored on a computer-readable medium, for example.

We claim:

1. An apparatus comprising:
an interface operable to receive a signal carrying information;
a timing phase selection module operatively coupled to the interface and operable to select, from a plurality of timing phases, a timing phase most closely aligned with a phase of the information carried by the received signal,
wherein the timing phase selection module comprises a sampling module operatively coupled to the interface and operable to sample the received signal at least once per timing phase of the plurality of timing phases,
wherein the timing phase selection module is operable to determine the timing phase most closely matched to the phase of the information carried by the received signal based on samples taken by the sampling module, wherein the sampling module is operable to sample the received signal multiple times per timing phase of the plurality of timing phases, and wherein the sampling module comprises:
a plurality of sets of multiple samplers, each set of samplers being operatively coupled to the interface and operable to sample the received signal multiple times according to a respective one of the plurality of timing phases.

2. The apparatus of claim 1, wherein the timing phase selection module is operable to select the timing phase most closely aligned with a phase of the information carried by the received signal for use in generating a clock signal to be used in processing the received signal.

3. An apparatus comprising:
an interface operable to receive a signal carrying information;
a timing phase selection module operatively coupled to the interface and operable to select, from a plurality of timing phases, a timing phase most closely aligned with a phase of the information carried by the received signal,
wherein the timing phase selection module comprises a sampling module operatively coupled to the interface and operable to sample the received signal at least once per timing phase of the plurality of timing phases,
wherein the timing phase selection module is operable to determine the timing phase most closely matched to the phase of the information carried by the received signal based on samples taken by the sampling module,
wherein the timing phase selection module further comprises:
a pattern detection module operatively coupled to the sampling module and operable to determine the timing phase most closely matched to the phase of the information carried by the received signal by comparing the samples taken by the sampling module to a predetermined pattern.

4. The apparatus of claim 3, wherein the sampling module is operable to sample the received signal once per timing phase of the plurality of timing phases, and wherein the sampling module comprises:
a plurality of samplers operatively coupled to the interface, each sampler being operable to sample the received signal according to a respective one of the plurality of timing phases.

5. The apparatus of claim 3, wherein the pattern detection module is controllable to select a number of the samples per timing phase taken by the sampling module to compare to the predetermined pattern.

6. The apparatus of claim 3, wherein the pattern detection module comprises combinational logic operable to receive the samples taken by the sampling module and to generate a timing phase selection signal based on the samples.

7. The apparatus of claim 6, wherein the combinational logic implements at least one of: a truth table and a voting algorithm.

8. The apparatus of claim 3, wherein the predetermined pattern comprises a known initial pattern of a burst of information, and wherein the pattern detection module is further operable to determine a start time of the burst of information in the received signal based on detection of the known initial pattern.

9. The apparatus of claim 3, wherein the plurality of timing phases comprises timing phases based on different types of level transitions of a timing signal.

10. The apparatus of claim 3, wherein the plurality of timing phases comprises respective timing signals having different phases relative to each other.

11. A Phase-Locked Loop (PLL) comprising:
an interface operable to receive a signal carrying information;
a timing phase selection module operatively coupled to the interface and operable to select, from a plurality of timing phases, a timing phase most closely aligned with a phase of the information carried by the received signal;
an oscillator operable to generate at least one timing signal comprising the plurality of timing phases;
a multiplexer operatively coupled to the oscillator and to the timing phase selection module, the multiplexer being operable to receive at an input the plurality of timing phases and to provide at an output the selected timing phase; and
a phase detector operatively coupled to the output of the multiplexer and to the oscillator, the phase detector being operable to detect a difference between the selected timing phase and a phase of the information carried by the received signal.

12. The PLL of claim 11,
wherein the timing phase selection module comprises a sampling module operatively coupled to the interface and operable to sample the received signal at least once per timing phase of the plurality of timing phases,
wherein the timing phase selection module is operable to determine the timing phase most closely matched to the phase of the information carried by the received signal based on samples taken by the sampling module,
wherein the phase detector is operable to sample at least one of the received signal and the selected timing phase, and
wherein the sampling module and the phase detector comprise shared samplers.

13. A method comprising:
providing at least one timing signal comprising a plurality of timing phases;
receiving a signal carrying information; and
selecting, from the plurality of timing phases, a timing phase most closely aligned with a phase of the information carried by the received signal,
wherein selecting comprises sampling the received signal at least once per timing phase of the plurality of timing phases,
wherein selecting comprises sampling the received signal multiple times per timing phase of the plurality of timing phases and comparing the multiple samples associated with each timing phase of the plurality of timing phases to a predetermined pattern.

14. The method of claim 13, wherein the timing phase most closely aligned with a phase of the information carried by the received signal is selected for use in generating a clock signal to be used in processing the received signal.

15. The method of claim 13, further comprising:
selecting a number of the samples per timing phase to compare to the predetermined pattern.

16. The method of claim 13, wherein the predetermined pattern comprises a known initial pattern of a burst of information, the method further comprising:
determining a start time of the burst of information in the received signal based on detection of the known initial pattern.

17. The method of claim 13, wherein the plurality of timing phases comprises timing phases based on different types of level transitions of the at least one timing signal.

18. The method of claim 13, wherein providing comprises providing a plurality of timing signals having different phases relative to each other.

19. An apparatus comprising:

a sampling module operable to receive a signal carrying information and to sample the received signal multiple times according to a plurality of timing phases; and a pattern detection module operatively coupled to the sampling module and operable to compare the multiple samples associated with each timing phase of the plurality of timing phases to a known initial pattern of a burst of information and to determine a start time of the burst of information in the received signal based on detection of the known initial pattern.

* * * * *